United States Patent
Mesch et al.

(10) Patent No.: US 12,494,433 B2
(45) Date of Patent: Dec. 9, 2025

(54) 3D EMBEDDED REDISTRIBUTION LAYERS FOR IC SUBSTRATE PACKAGING

(71) Applicant: Apple Inc., Cupertino, CA (US)

(72) Inventors: Ryan Mesch, Phoenix, AZ (US); Jun Chung Hsu, Cupertino, CA (US)

(73) Assignee: Apple Inc., Cupertino, CA (US)

(*) Notice: Subject to any disclaimer, the term of this patent is extended or adjusted under 35 U.S.C. 154(b) by 712 days.

(21) Appl. No.: 17/806,660

(22) Filed: Jun. 13, 2022

(65) Prior Publication Data

US 2023/0402390 A1     Dec. 14, 2023

(51) Int. Cl.
*H01L 23/538* (2006.01)
*H01L 21/48* (2006.01)

(52) U.S. Cl.
CPC ...... *H01L 23/5383* (2013.01); *H01L 21/4857* (2013.01); *H01L 23/5386* (2013.01)

(58) Field of Classification Search
CPC ............. H01L 21/4857; H01L 23/5383; H01L 23/5386; H01L 23/49838; H01L 23/49822
See application file for complete search history.

(56) References Cited

U.S. PATENT DOCUMENTS

| | | | |
|---|---|---|---|
| 2009/0288870 A1* | 11/2009 | Kondo | H01L 21/4846 205/125 |
| 2016/0133571 A1 | 5/2016 | Lee et al. | |
| 2018/0342461 A1* | 11/2018 | Liu | H01L 23/15 |
| 2019/0198436 A1* | 6/2019 | Vadlamani | H05K 1/00 |
| 2020/0258847 A1 | 8/2020 | Pietambaram et al. | |
| 2020/0335441 A1* | 10/2020 | Kim | H01L 23/562 |
| 2021/0082797 A1* | 3/2021 | Lee | H01L 23/49822 |
| 2021/0159211 A1 | 5/2021 | Rubin et al. | |

* cited by examiner

*Primary Examiner* — Marlon T Fletcher
*Assistant Examiner* — Christina A Sylvia
(74) *Attorney, Agent, or Firm* — Kowert, Hood, Munyon, Rankin & Goetzel, P.C.; Gareth M. Sampson; Dean M. Munyon (57) ABSTRACT

Improved redistribution layer structures for integrated circuit or system-on-chip (SoC) packages substrate are disclosed. Via landing pads and via interconnects in the redistribution layers are self-aligning with the centers of the vias aligning with the pads. This self-alignment may allow pads that terminate non-stacked vias to have decreased widths or diameters without extra capture space. The redistribution layers have vias with vertical or near vertical sidewalls. Vias may also have various shapes, widths, or lengths. Traces in the redistribution layers may have various lengths and shapes with lengths that may extend into layers routing the vias to provide increased metal density in the traces.

18 Claims, 9 Drawing Sheets

3D EMBEDDED REDISTRIBUTION LAYERS FOR IC SUBSTRATE PACKAGING

BACKGROUND

Technical Field

Embodiments described herein relate to integrated circuit packaging. More particularly, embodiments described herein relate to redistribution layers for integrated circuit packages.

Description of the Related Art

Current integrated circuit devices are being pushed towards increased integration of functionality and optimization of power/performance. For example, a single integrated circuit package may include multiple instances of any of integrated circuits, integrated passive devices, memory devices, etc. With multiple devices placed on a single package, there is increased need for improvements in the design and manufacturing of device packages.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

The present disclosure is directed to a redistribution layers (RDLs) implemented in integrated circuit (IC) packages. One example of an IC package is a system-on-chip (SoC) package. As used herein, a "redistribution layer (RDL)" refers to an insulating layer having wiring metal interconnections that redistribute access (e.g., connection) between displaced locations on a device or package coupled to the redistribution layer. RDLs are often coupled to surfaces (such as bonding surfaces) of IC devices or IC substrate packages to provide routing (e.g., routing for power or signal connections) between displaced locations on the surfaces. For example, one redistributed route (e.g., reroute) in an RDL may route from a connection at a first location on a surface of an IC package to a connection at a second, displaced location (e.g., a horizontally displaced location) on the surface of the IC package.

In various embodiments, an RDL provides routing between connection locations on the same side of the RDL (e.g., from one location on a first side of the RDL to another (displaced) location on the first side of the RDL). In some embodiments, an RDL provides routing between connection locations on opposite sides of the RDL (e.g., from a first location on a first (top) side of the RDL to a second, displaced location on the second (back) side of the RDL). In some embodiments, an RDL may include combinations of the above types of routing and thus have routes both between displaced locations on the same sides of the RDL and displaced locations on opposite sides of the RDL.

Figure 1:
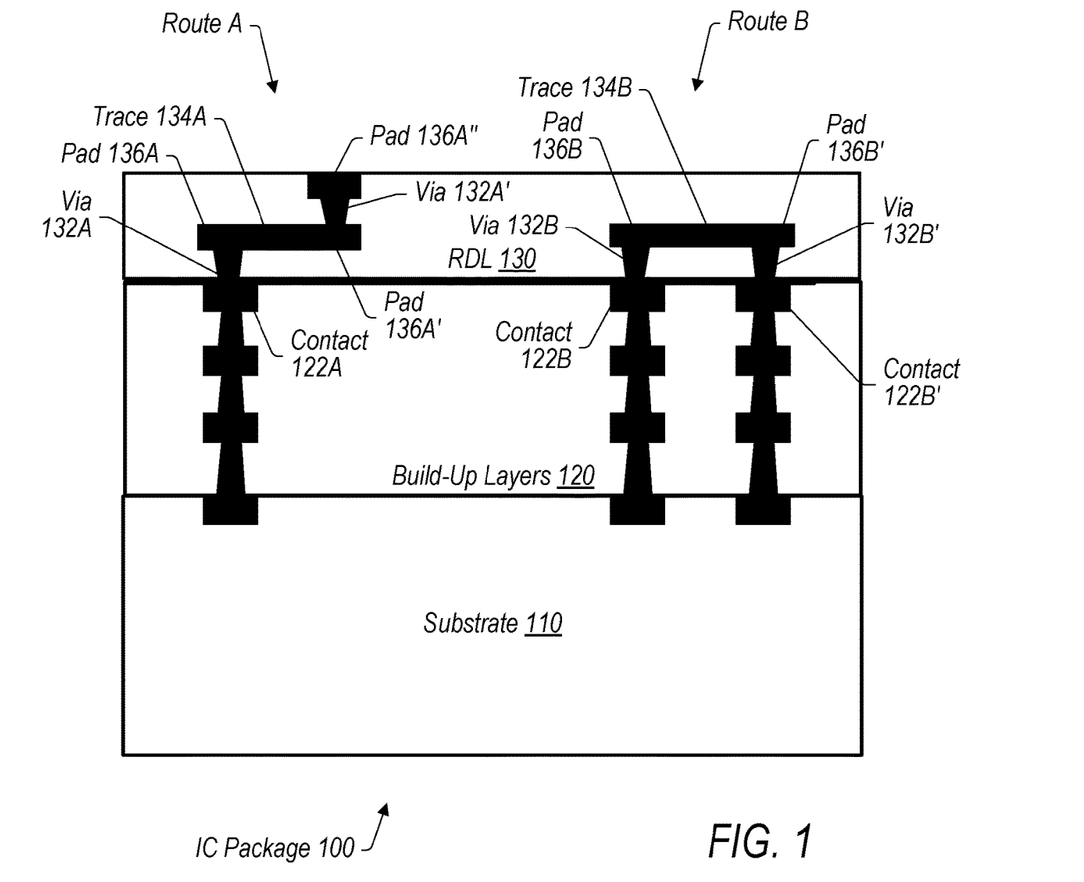
FIG. 1 depicts a representation of an example embodiment of an IC package with an RDL.

FIG. 1 depicts a representation of an example embodiment of an IC package with an RDL. In the illustrated embodiment, IC package 100 includes substrate 110, build-up layers 120, and RDL 130. It should be understood that the illustrated embodiment of IC package 100 is a simple depiction of an IC package for ease in understanding the disclosed invention and that IC package 100 may include any number of other components such as, but not limited to, integrated circuit devices, passive devices, memory devices, and additional routing features. Additional routing features may include, for example, any number of conductive vias, traces, or contacts for routing power/signals through an IC package.

In the illustrated embodiment, RDL 130 includes "Route A" and "Route B" with vias 132A, trace 134A, and pads 136A in Route A and vias 132B, trace 134B, and pads 136B in Route B. Route A connects to contact 122A in build-up layers 120 with via 132A on a first side of RDL 130 (e.g., the side in contact with the build-up layers 120). Via 132A then connects to trace 134A at pad 136A. Trace 134A routes to pad 136A', which connects to via 132A'. Via 132A' provides final routing to pad 136A" on a second side of the RDL (e.g., the side opposite build-up layers 120).

Route B routes between contact 122B and contact 122B' with both contacts on the first side of RDL 130 in build-up layers 120. Contact 122B connects to the routing at via 132B, which connects to trace 134B at pad 136B. Trace 134B then routes to pad 136B'. Pad 136B' connects to via 132B', completing the route between contact 122B and contact 122B'. Both Route A and Route B displace (e.g., reroute or redistribute) connections to different locations in IC package 100. For instance, traces 134A, 134B reroute connections horizontally in the embodiment depicted in FIG. 1.

Current processes for forming RDLs include subtractive processes and semi-additive processes (SAPs). One example of an SAP is a modified semi-additive process (mSAP). Subtractive processes typically use photoresist to define areas not to be etched during etching processes. Due to the thickness of the copper being etched, the time for etching can be long and the etchant can attack sides of traces during the etch process. Thus, the feature (e.g., pattern) resolution that can be provided is limited using subtractive processes and smaller, fine pitches can be difficult to produce using subtractive processes.

SAPs, such as mSAP, may provide finer feature resolution than subtractive processes as thinner copper foil is used. Thus, there is less side etching than the subtractive process. mSAP, however, uses laser ablation for etching and the laser ablation is still limited in resolution (e.g., smallest vias capable of being formed are about 20 μm in diameter). Additionally, laser ablated sidewalls are non-straight (e.g., non-vertical), which contributes to area and pattern resolution costs.

The present disclosure contemplates various techniques that are capable of producing RDL structures with fine resolutions. Embodiments of RDL structures contemplated herein are self-aligning and can have traces with various shapes and thicknesses. Additionally, the processing techniques described herein for forming RDL structures are more reliable as the techniques are less susceptible to impurity contamination and grain structure problems, which are issues in many current RDL processes.

One embodiment disclosed herein has three broad elements: 1) redistribution structures formed on a substrate where the redistribution structures include a redistribution layer having a first routing layer of vias and a second routing layer of pads and traces in an organic dielectric material, 2) the pads are individually coupled and aligned to vias in the via layer, and 3) at least one trace that extends into the first routing layer with the trace having a depth (e.g., thickness in vertical or z-direction) that is at least a depth of the second routing layer. In some embodiments, centers of the pads and the vias are horizontally aligned. For example, centers of the pads are aligned with centers of the vias when the pads and vias are formed in a self-aligning process, as described herein. In certain embodiments, sidewalls of the vias are substantially vertical sidewalls (e.g., the sidewalls appear straight and essentially vertical in a cross-section of the vias). In some embodiments, the vias have a width of at most 15 μm while the sidewalls of the vias have a surface roughness of at most 100 nm.

In various embodiments, the traces include traces with varying depths in the second routing layer. Additionally, traces may have various shapes terminating the traces in the vertical (e.g., z-) direction. In certain embodiments, the traces have widths in the horizontal direction that are at most 5 In some embodiments, the widths of the traces vary with a maximum width of 5 μm for the traces. Additional embodiments are contemplated where any of the traces, vias, or pads have multi-tiered shapes in the vertical direction. For instance, any of the traces, vias, or pads may have a stepped or multi-terraced shape in the vertical direction.

In short, the present inventors have recognized that RDLs with various advantageous properties can be generated for redistribution on package substrates. Putting the disclosed RDLs in package substrates can provide improved performance in the packages by increasing metal (e.g., copper volume) in traces and vias to reduce resistance in the RDLs. Additionally, the fabrication techniques for forming RDLs described herein may involve less process steps and be more reliable than previous techniques. The various embodiments of RDL structures contemplated herein also provide more flexibility in design and implementation of the various routing features (e.g., vias, traces, and pads) in the RDLs.

Figure 2:
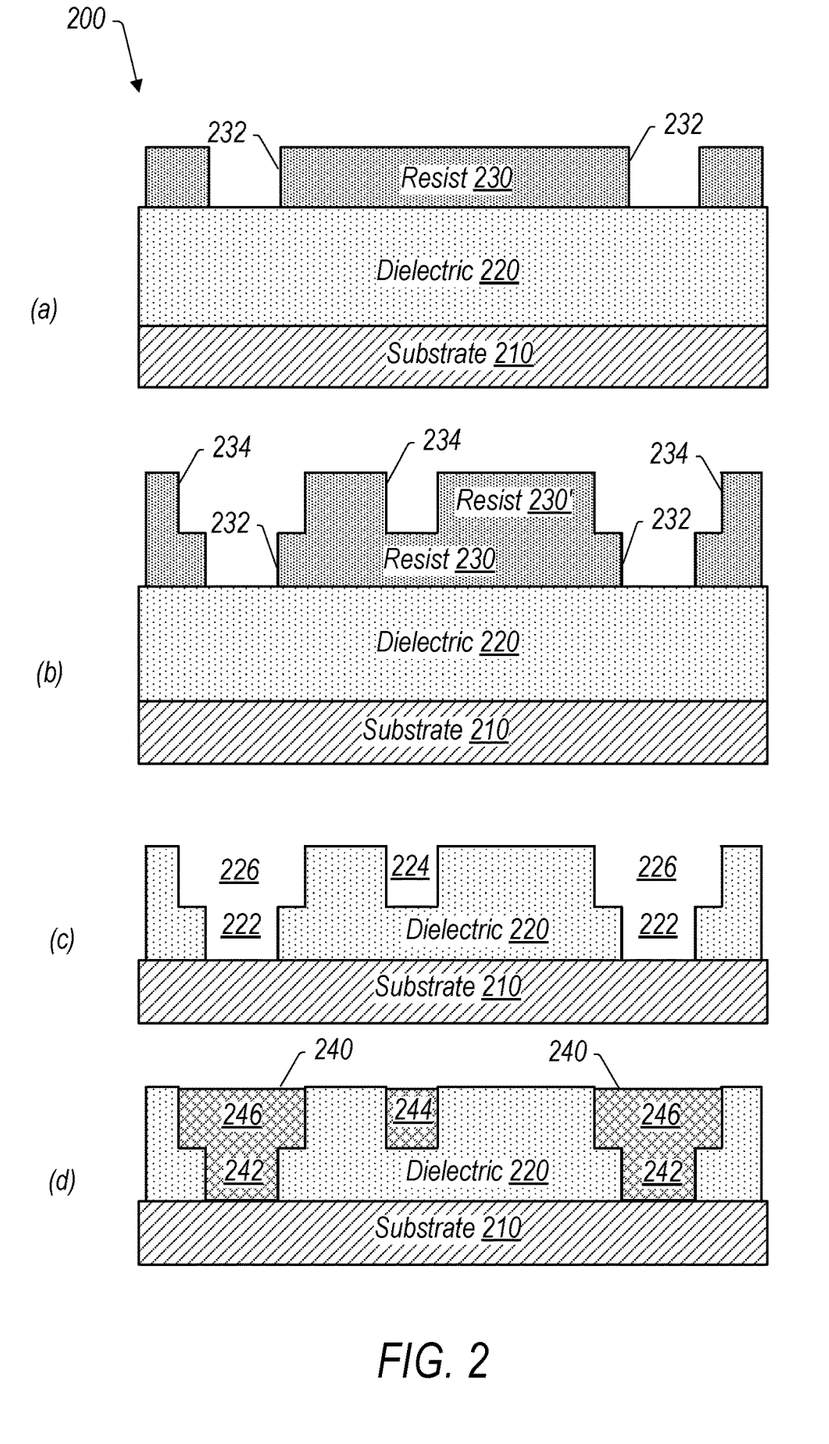
FIG. 2 depicts a side-view cross-sectional representation of a process for forming an RDL on a package substrate, according to some embodiments.

FIG. 2 depicts a side-view cross-sectional representation of a process for forming an RDL on a package substrate, according to some embodiments. Process 200 may be referred to as a two-step lithography defined, dry etch transfer process that includes the illustrated steps of (a)-(d). Further processing steps may be involved in addition to the illustrated steps. In the illustrated embodiment, in (a), package substrate 210 has dielectric 220 and resist 230 formed over the substrate. Substrate 210 may be any substrate typical for integrated circuit packaging. For instance, substrate 210 may be a silicon substrate, a pre-preg laminated core substrate, or a coreless laminated substrate. In certain embodiments, dielectric 220 is an organic dielectric while resist 230 is a resist that is implemented for dry etching of dielectric material. For example, dielectric 220 may be ABF (Ajinomoto Build-up Film) dielectrics or another filled dielectric. In the illustrated embodiments, the RDL formed is a two-layer RDL with a first routing layer for layer-to-layer via interconnects and a second routing layer for via landing pads and traces.

In certain embodiments, as shown in (a), resist 230 is patterned in a first lithography step to form via pattern 232 (e.g., the first routing layer pattern). In various embodiments, via pattern 232 is formed using a lithography stepper instrument. In (b), process 200 continues with deposition of a second layer of resist 230' followed by a second lithography step to form pad/trace pattern 234 (e.g., the second routing layer pattern) in the second layer of resist above via pattern 232. In various embodiments, pad/trace pattern 234 is formed using a photolithography instrument. After pad/trace pattern 234 is formed above via pattern 232, in (c), dielectric 220 may be etched using via pattern 232 and pad/trace pattern 234 to define the etching of the dielectric. In certain embodiments, dielectric 220 is etched using a dry etch process. One example of a dry etch process is an $O_2/F$ dry etch that selectively etches dielectric material (e.g., dielectric 220) over a photoresist material (e.g., resist 230).

Etching of dielectric 220 forms via openings 222, trace openings 224, and pad openings 226 in the dielectric, as shown in (c). Via openings 222, trace openings 224, and pad openings 226 are formed according via pattern 232 and pad/trace pattern 234. Thus, as shown in (c), via openings 222, trace openings 224, and pad openings 226 have similar shapes and depths to the openings in via pattern 232 and pad/trace pattern 234 from (b).

In (d), via openings 222, trace openings 224, and pad openings 226 are filled with metal 240 (e.g., copper) to form vias 242 (e.g., layer-to-layer via interconnects), traces 244, and pads 246 (e.g., via landing pads) on substrate 210. The metal may be filled in via openings 222, trace openings 224, and pad openings 226 by electroplating or another trench filling process for metal. As via openings 222 and pad openings 226 are filled simultaneously (e.g., in a single plating step), the metal integrity between vias 242 and pads 246 is improved over processes that form vias and pads in separate processes to avoid photoresist contamination risk at a bottom of via 242.

Figure 3:
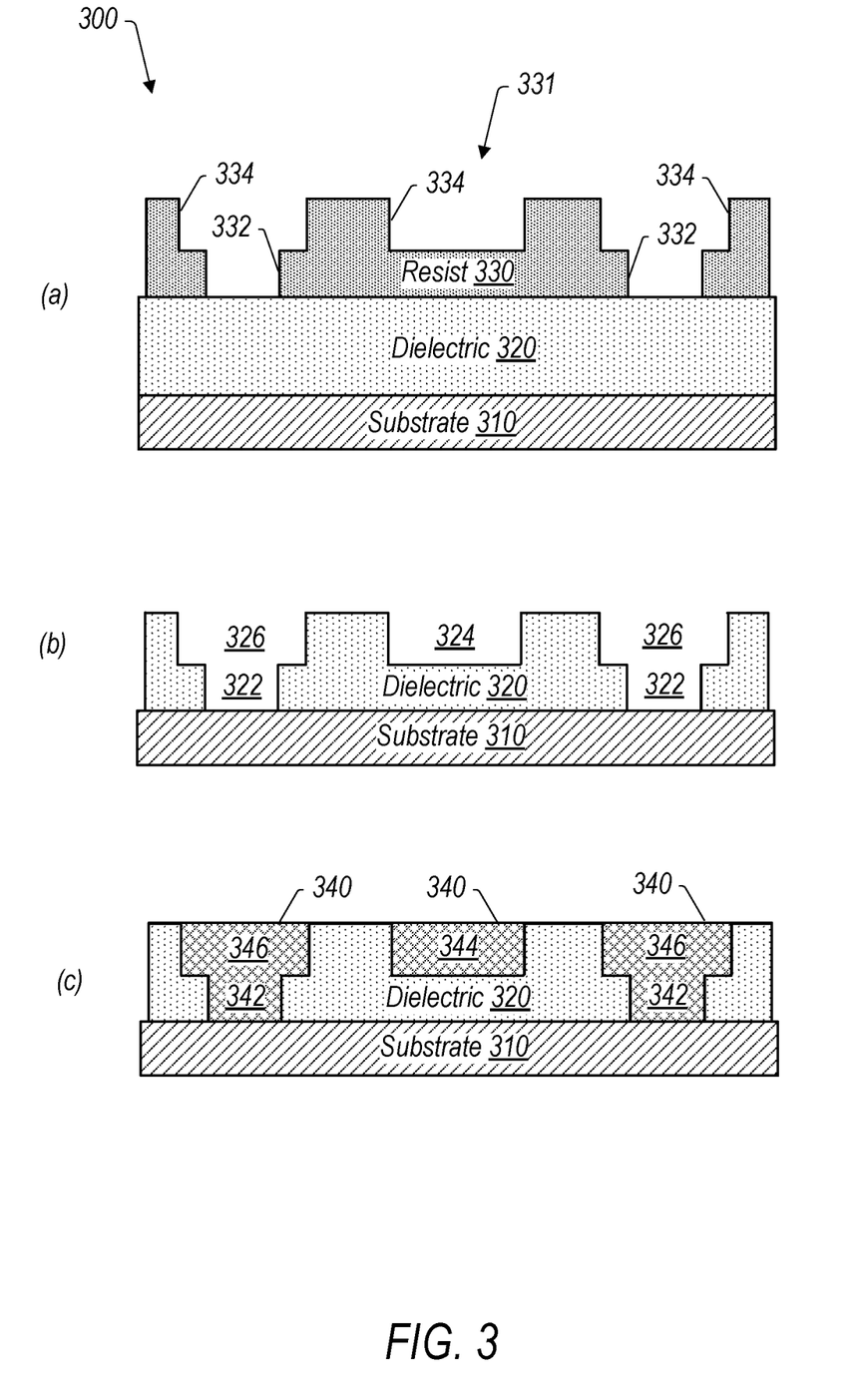
FIG. 3 depicts a side-view cross-sectional representation of another process for forming an RDL on a package substrate, according to some embodiments.

FIG. 3 depicts a side-view cross-sectional representation of another process for forming an RDL on a package substrate, according to some embodiments. Process 300 may include defining a resist with direct pattern transfer (e.g., direct imprint) followed by a single step dry etch transfer process to form openings for vias, traces, and pads. Further processing steps may be involved in addition to the illustrated steps. In the illustrated embodiment, in (a), package substrate 310 has dielectric 320 (e.g., organic dielectric or ABF) and resist 330 formed over the substrate and the RDL formed is a two-layer RDL with a first routing layer for vias and a second routing layer for pads and traces.

As shown in (a), resist 330 is patterned to define pattern 331 in resist 330. Pattern 331 may include via pattern 332 and pad/trace pattern 334. In certain embodiments, pattern 331 is defined in a single process step. For instance, both via pattern 332 and pad/trace pattern 334 may be defined in a single step (e.g., a single direct pattern transfer step). In some embodiments, a direct imprint process may form pattern 331 with via pattern 332 and pad/trace pattern 334 in a single process step. In certain embodiments, the direct imprint process is a imprint lithography (IL) process, which uses a stamp device to directly create a pattern in resist 330, or a hot-embossing lithography process. Thus, via pattern 332 and pad/trace pattern 334 are formed in resist 330 according to a design of the stamp device implemented in the direct imprint process. In various embodiments, the direct imprint process includes a full panel stamper (e.g., no repeat stamp) or a stamp and repeat process.

After patterning of resist 330 to form pattern 331, dielectric 320 may be dry etched to form via openings 322, trace openings 324, and pad openings 326, as shown in (b). Via openings 322, trace openings 324, and pad openings 326 are formed according to pattern 331. Thus, as shown in (b), via openings 322, trace openings 324, and pad openings 326 have similar shapes and depths to the openings in via pattern 332 and pad/trace pattern 334 from (a).

In (c), via openings 322, trace openings 324, and pad openings 326 are filled with metal 340 (e.g., copper) to form vias 342, traces 344, and pads 346 on substrate 310. The metal may be filled in via openings 322, trace openings 324, and pad openings 326 by electroplating or another trench filling process for metal. As described above, via openings 322 and pad openings 326 are filled simultaneously (e.g., in a single plating step) and thus the metal integrity between vias 342 and pads 346 is improved over processes that form vias, traces, and pads in separate processes.

Figure 4:
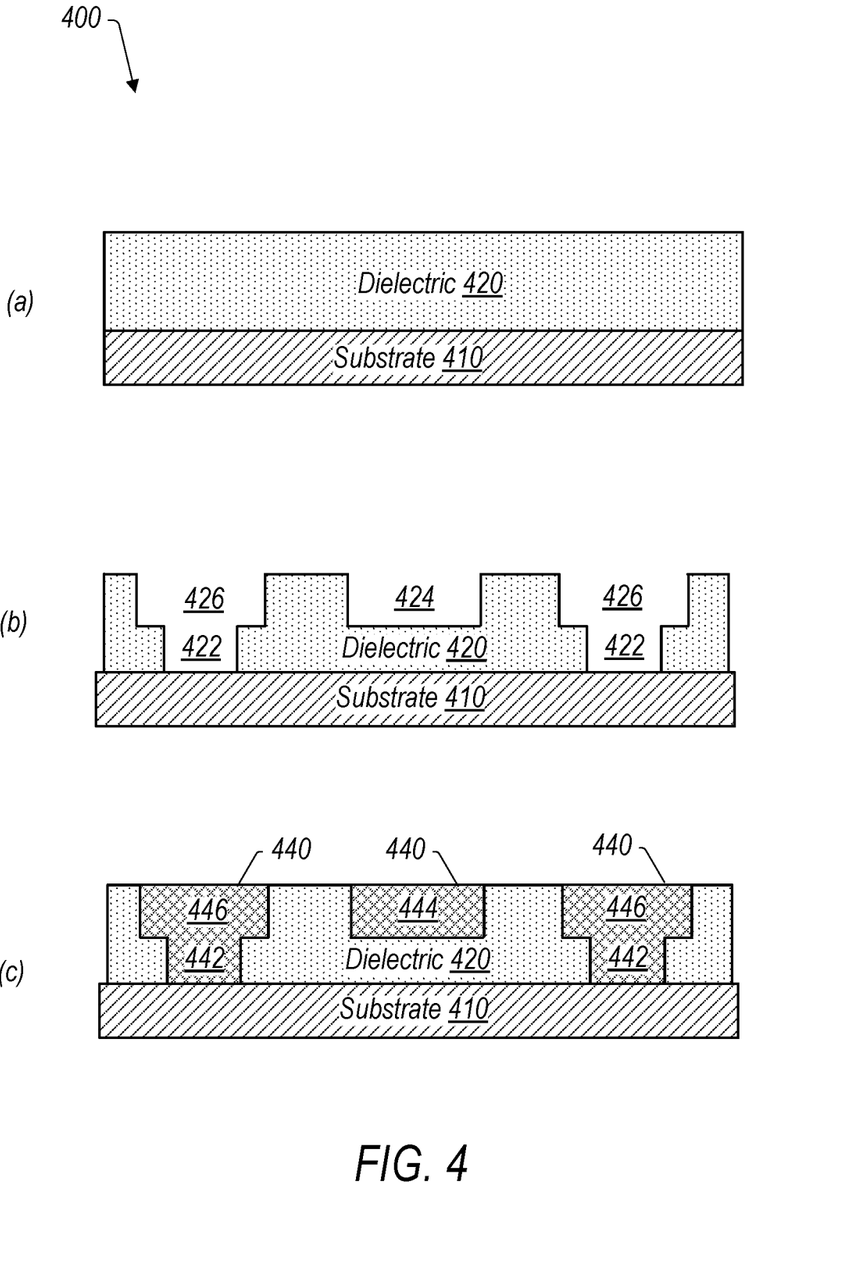
FIG. 4 depicts a side-view cross-sectional representation of a process for forming an RDL on a package substrate using direct pattern transfer into the dielectric material, according to some embodiments.

Additional embodiments may be contemplated where via openings, trace openings, and pad openings are formed by directly transferring the pattern into the dielectric. Such embodiments may be possible when tools for direct imprinting of dielectric material are available and the dielectric material allows direct imprinting (e.g., the dielectric material is coated in a manner to be compatible with imprint lithography, hot-embossing lithography, or another direct imprinting technique). FIG. 4 depicts a side-view cross-sectional representation of a process for forming an RDL on a package substrate using direct pattern transfer into the dielectric material, according to some embodiments. Process 400 includes defining a dielectric with direct imprint followed by a via, trace, and pad filling process. In the illustrated embodiment, the RDL formed is a two-layer RDL with a first routing layer for vias (e.g., layer-to-layer via interconnects) and a second routing layer for pads (e.g., via landing pads) and traces. Further processing steps may be involved beyond the illustrated steps.

In the illustrated embodiment, process 400 begins in (a) with dielectric 420 (e.g., organic dielectric or a filled dielectric such as ABF) formed over package substrate 410. Contrary to the prior illustrated processes, neither a resist nor a resist pattern is formed in process 400. Process 400 continues in (b) with direct pattern transfer into dielectric 420 to form via openings 422, trace openings 424, and pad openings 426. In certain embodiments, via openings 422, trace openings 424, and pad openings 426 are defined in a single step. For instance, a direct imprint process (such as IL, described above) may form via openings 422, trace openings 424, and pad openings 426 in dielectric 420 with a single process step. Similar to process 300, via openings 422, trace openings 424, and pad openings 426 may be formed in dielectric 420 according to a design of the stamp device implemented in the direct imprint step of process 400.

After via openings 422, trace openings 424, and pad openings 426 are formed, the via openings, trace openings, and pad openings are filled with metal 440 (e.g., copper) to form vias 442, traces 444, and pads 446 on substrate 410, as shown in (c). Metal 440 may be filled in via openings 422, trace openings 424, and pad openings 426 by electroplating or another trench filling process for metal. As with process 300, via openings 422 and pad openings 426 are filled simultaneously (e.g., in a single plating step) and thus the metal integrity between vias 442 and pads 446 is improved over processes that form vias and pads in separate processes. It should be noted that while FIGS. 3 and 4 depict traces and pads separately, embodiments are contemplated where traces and pads that interconnect, as shown in additional figures described herein.

Additionally, both process 300 and process 400 reduce the number of process steps compared to process 200, shown in FIG. 2, with process 400 having the fewest amount of steps for the disclosed embodiments. The implementation of direct pattern transfer (e.g., direct imprint) techniques into forming the RDLs in process 300 and process 400 may produce better pattern fidelity in the transfer of the designed pattern to the manufactured pattern than transfer of the pattern by process 200 or other current processes (such as wet etching processes). In various embodiments, by implementing a direct pattern transfer process, process 300 and process 400 are further capable of forming more complex three-dimensional (3D) shapes than available in the current state of the art. Implementing the direct pattern transfer process may also allow the implementation of ABF dielectrics or other filled dielectrics, which are simpler and more reliable materials for use in IC packages.

Figure 5:
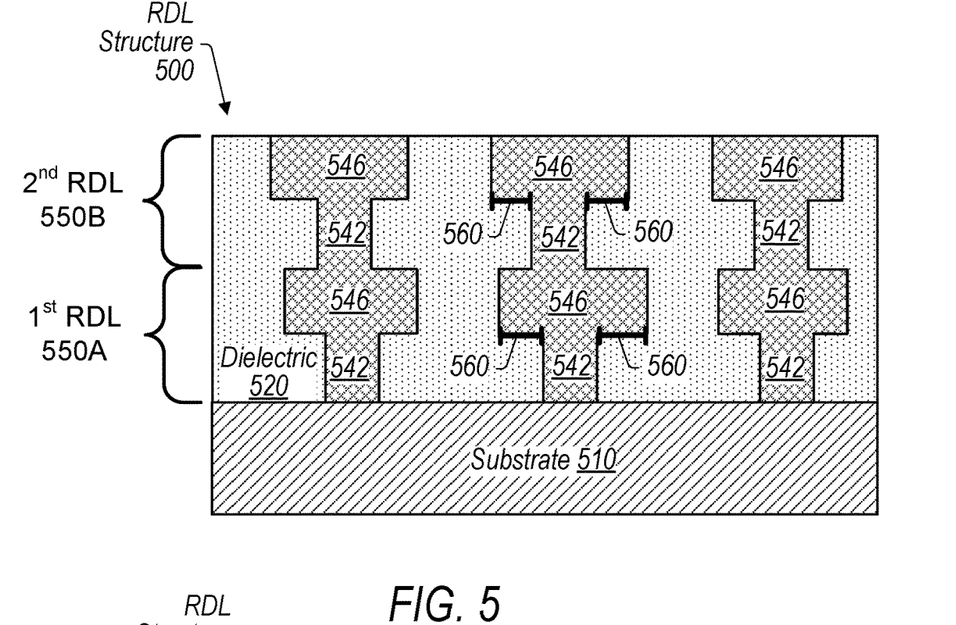
FIG. 5 depicts a side-view cross-sectional representation of various embodiments of vias and pads in an RDL structure formed on a package substrate.

Additional advantages of implementing the direct pattern transfer (e.g., direct imprint) technique in process 300 or process 400 are described with respect to FIGS. 5-9. FIG. 5 depicts a side-view cross-sectional representation of various embodiments of vias and pads in an RDL structure formed on a package substrate. RDL structure 500 includes two RDL layers (first RDL 550A and second RDL 550B) in dielectric 520 on substrate 510. Each RDL 550 includes a first routing layer with vias 542 and a second routing layer with pads 546. It should be noted that FIG. 5 depicts first RDL 550A and second RDL 550B having the same pattern of vias and pads for simplicity in description and that many additional embodiments can easily be contemplated where the pattern in first RDL 550A differs from the pattern in second RDL 550B. Additionally, the patterns of first RDL 550A and second RDL 550B would typically include traces, which are not shown in FIG. 5 for simplicity in the description.

In certain embodiments, each RDL 550 is separately formed by implementation of process 300 (shown in FIG. 3) or process 400 (shown in FIG. 4). For instance, first RDL 550A may be formed in a first process implementing a direct imprint technique and second RDL 550B may be formed in a second, subsequent process. As described above, vias 542 and pads 546 in each RDL 550 are defined by openings formed in a single process step (e.g., the direct imprint process step). Because vias 542 and pads 546 are defined during the single process step, the top of the vias and the bottom of the traces in each RDL 550 are self-aligned. For instance, as shown by the spacing lines 560 in FIG. 5, pads 546 have equal spacing on both sides of vias 542 in each RDL 550. Accordingly, the centers at the bottom of pads 546 are aligned with the centers at the top of vias 542 (e.g., the horizontal centers of the bottom surface of the pads and the horizontal centers of the top surfaces of the vias are aligned in FIG. 5).

Figure 6:
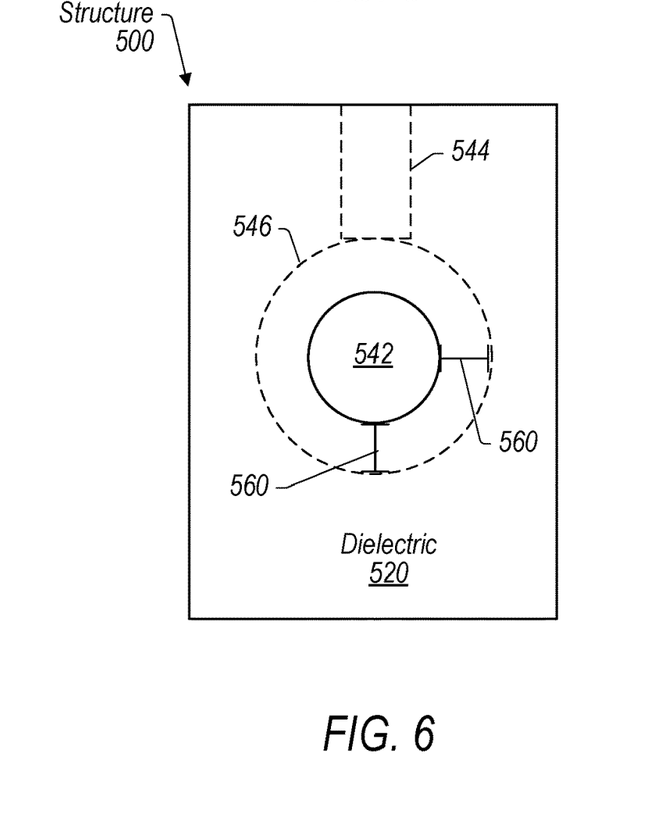
FIG. 6 depicts a top-view representation of a via and a pad from the RDL structure of FIG. 5, according to some embodiments.

FIG. 6 depicts a top-view representation of a via and a pad from the RDL structure of FIG. 5, according to some embodiments. In the illustrated embodiment, via 542 is aligned over pad 546, which is connected to trace 544. As shown in FIG. 6, the center of via 542 is aligned with the center of pad 546. With the alignment between the centers of via 542 and pad 546, the outer diameter of pad 546 is equidistant from the outer diameter of via 542, as shown by spacing lines 560. This substantially "perfect" alignment is capable of being achieved because via 542 and pad 546 are defined by a single, imprinted pattern in dielectric 520, as described herein.

Figure 7:
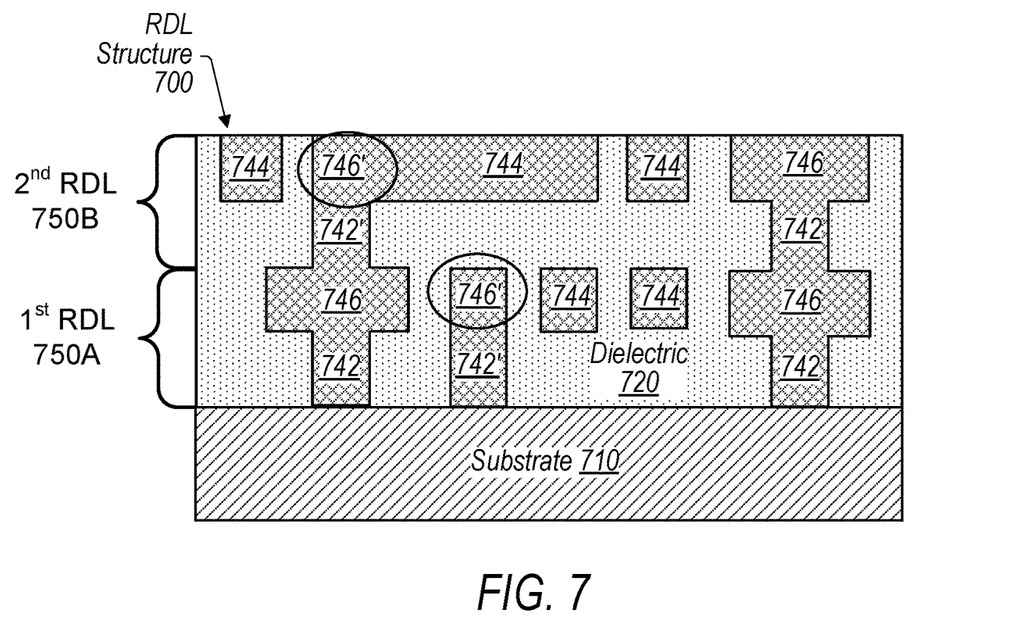
FIG. 7 depicts a side-view cross-sectional representation of various embodiments of vias, pads, and traces in an RDL structure formed on a package substrate.

FIG. 7 depicts a side-view cross-sectional representation of various embodiments of vias, pads, and traces in an RDL structure formed on a package substrate. RDL structure 700 includes two RDL layers (first RDL 750A and second RDL 750B) in dielectric 720 on substrate 710. Each RDL 750 includes a first routing layer with vias 742 and a second routing layer with traces 744 and pads 746. The illustration depicts that pads 746' (inside the circles), which terminate non-stacked vias 742', can be smaller pad structures (e.g., smaller in width).

The smaller pad structures depicted in FIG. 7 are allowed due to the alignment (e.g., self-alignment or auto-alignment) between vias 742' and pads 746' provided in the pattern formed by the direct pattern transfer (e.g., direct imprint) process. For instance, pads in processes with separate patterning for pads and vias are formed as "capture pads" with areas larger than the areas of the vias connecting to the pads to allow for a margin of error in alignment between the pads and vias during patterning. With the self-alignment (e.g., the near perfect alignment) between vias 742' and pads 746' described herein, however, the extra area (e.g., the capture space) is not needed and the extra capture space can be removed. Removal of this extra capture space in the pads connecting to non-stacked vias may allow for greater pattern density in RDLs with such features.

It should be noted that larger capture pads may still be needed where the via is stacked on another pad or trace. For instance, as shown in FIG. 7, pads 746 are positioned above vias 742 that have additional vias stacked above them. Accordingly, pads 746 are sized to be "capture pads" with areas larger than vias 742 connecting to the pads.

Figure 8:
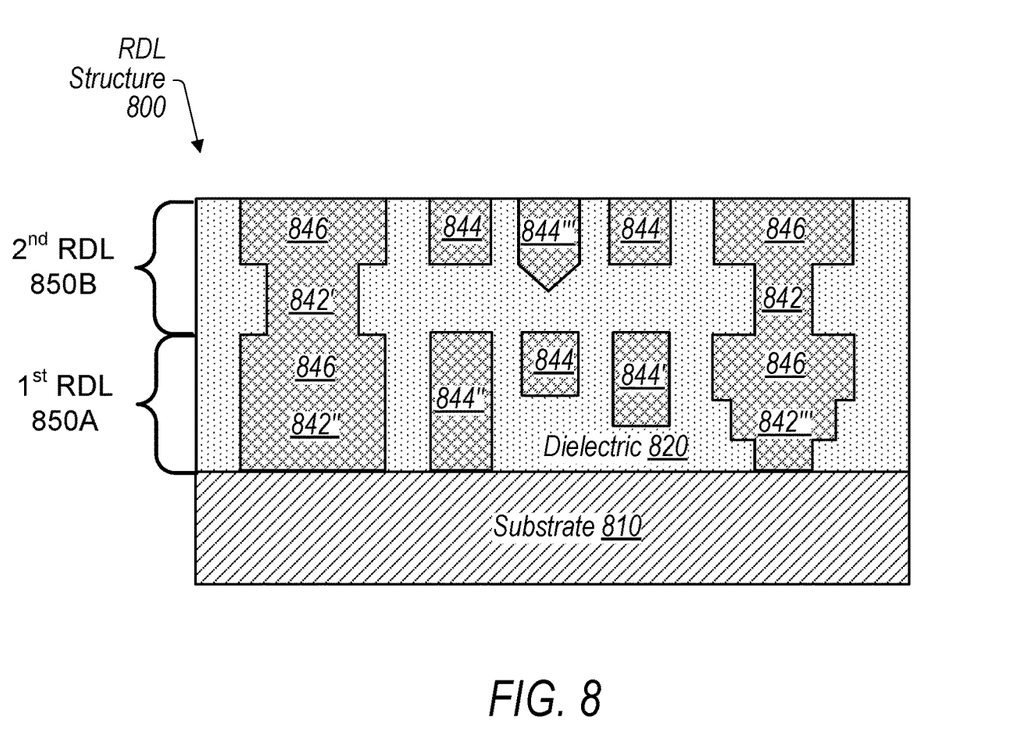
FIG. 8 depicts a side-view cross-sectional representation of additional embodiments of vias, pads, and traces in an RDL structure formed on a package substrate.

FIG. 8 depicts a side-view cross-sectional representation of additional embodiments of vias, pads, and traces in an RDL structure formed on a package substrate. RDL structure 800 includes two RDL layers (first RDL 850A and second RDL 850B) in dielectric 820 on substrate 810. Each RDL 850 includes a first routing layer with vias 842 and a second routing layer with traces 844 and pads 846.

In various embodiments, vias 842 formed by techniques described herein may vary in size (e.g., thickness or width in horizontal direction), shape, length (in vertical direction), or combinations thereof. The size, shape, and length of vias 842 may be varied as vias openings are now defined by direct imprinting of a pattern and the dimensions of the vias are no longer limited by the circular apertures associated with laser drilling of vias, slow skiving rates, or alignment issues. For instance, as shown in FIG. 8, via 842, via 842' and via 842" have different thicknesses. Additionally, via 842''' has a multi-tiered shape in the vertical direction (e.g., the via has a structure with stepped sections). In some embodiments, the lengths (in vertical direction) of the steps may be varied. Additional embodiments may also be contemplated with traces 844 and/or pads 846 having multi-tiered shapes similar to the structure of the via 842'''.

In certain embodiments, the width and spacing (e.g., lines and spaces (L/S) dimension) of traces 844 in an RDL 850 is defined at a predetermined value and does not vary between traces in the RDL. The width and spacing may not vary to provide predictable alignment and overlay of traces in the RDL. (e.g., a predetermined). The embodiments of RDL processes described herein, however, are capable of fabricating RDLs with width and spacing dimensions that are smaller (e.g., finer) than RDLs fabricated by current methods. For example, a width and spacing for traces 844 below 5 μm may be contemplated for the RDL structures described herein whereas the width and spacing for current methods is typically limited to around 6 μm using subtractive processes or SAPs due to the wet etching steps in these processes. In some embodiments, a width and spacing for traces 844 of 2 μm may be contemplated for the RDL structures described herein.

In some embodiments, traces 844 may vary in length (in the vertical dimension). For example, trace 844 may have a length that is different than a depth (e.g., height in the vertical dimension) of the routing layer in which the trace is located. In various embodiments, trace 844 has a length that is greater than the depth of the routing layer. For instance, trace 844' has a length that is greater than the depth of the routing layer in which the trace is located (e.g., the second routing layer) and extends into the routing layer for vias 842 (e.g., the first routing layer). Some embodiments may be contemplated where a trace extends a combined depth of both routing layers. For instance, as shown in FIG. 8, trace 844" extends the combined depth of the routing layer for vias 842 and the routing layer for traces 844 and pads 846. Additional embodiments may be contemplated where a trace may have a length that is less than the depth of its routing layer.

In various embodiments, end portions of traces may have varying shapes. For example, in addition to the multi-tiered shapes described above, traces may have end portions with non-rectangular shapes (e.g., irregular polygon shapes). For instance, trace 844''', shown in FIG. 8, depicts one contemplated embodiment where the end portion of the trace has a triangular shape. In various embodiments, the shape of the end portions of traces may varied along with the length of the traces. For example, in some embodiments, the end portion with the non-rectangular shape extends into the routing layer for the vias while in other embodiments, the end portion may be in the routing layer for the traces and pads. Thus, traces may have various lengths, shapes, or combinations thereof. It should be further noted that the shapes of vias, pads, and traces (such as tiered or irregular polygon shapes) may only be limited to shapes that can be defined by a stamp used in the direct imprint process that defines the patterns for vias, pads, and traces.

Another advantage of implementing process 300 or process 400 in the fabrication of RDL structures may also be found in the shapes for the sidewalls of vias 742 and vias 842, shown in FIGS. 7 and 8, respectively. In the illustrated embodiments, vias 742 and vias 842 have substantially vertical sidewalls (e.g., the sidewalls are vertical or nearly vertical (such as within ±2° of vertical)). Vertical sidewalls are nearly impossible to achieve with laser ablation methods due to absorption and heating effects during the ablation process. Vertical sidewalls of vias 742 and vias 842, however, are possible with the implementation of the direct pattern transfer (e.g., direct imprint) process for creating the openings for the vias, as described herein. Additionally, the vertical sidewalls of vias 742 and vias 842 may create a nearly perfect 90° angle into the connecting pad or trace as there is no undercutting, voiding, or rounding caused by wet etching.

The size (e.g., width or diameter) of a via created by laser ablation is also limited, with 20 μm generally being the smallest size available using the laser tool. Vias 742 and vias 842, however, are capable of sizes (e.g., widths or diameters) below 15 μm. In one contemplated embodiment, vias 742 and vias 842 may have a diameter of 10 μm. These smaller via sizes allow for finer pattern resolution and higher pattern density in RDL structures.

Figure 9:
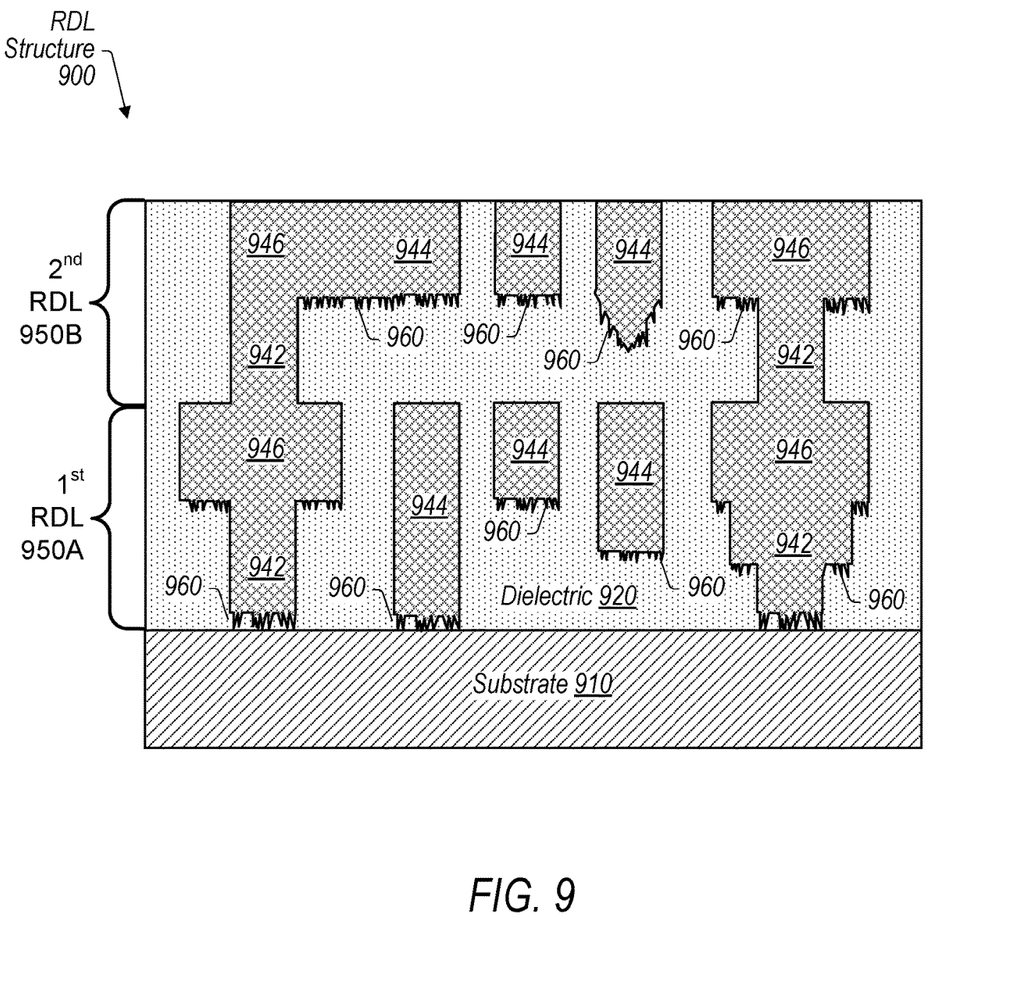
FIG. 9 depicts a side-view cross-sectional representation of embodiments of vias, pads, and traces in an RDL structure formed on a package substrate.

Turning back to FIG. 3, process 300 includes a step of dry etching dielectric 320 as defined by pattern 331 to form via openings 322, trace openings 324, and pad openings 326. Dry etching of dielectric 320 using pattern 331 in process 300 may provide various advantages due to the nature of dry etching the dielectric material. FIG. 9 depicts a side-view cross-sectional representation of embodiments of vias, pads, and traces in an RDL structure formed on a package substrate by process 300. RDL structure 900 includes two RDL layers (first RDL 950A and second RDL 950B) in dielectric 920 on substrate 910. Each RDL 950 includes a first routing layer with vias 942 and a second routing layer with traces 944 and pads 946.

As shown in FIG. 9, the bottoms of vias 942, traces 944, and pads 946 without any connecting structure to the bottoms have roughened (e.g., hair-like) surfaces 960 whereas the tops and sides of these structures have smooth surfaces. Surfaces 960 may be created due to some overetching of dielectric 920 during the dry etch process. For example, overetching with ion bombardment may create the hair-like shapes of surfaces 960. This surface roughening due to overetching creates a roughened surface in openings (such as via openings, trace openings, or pad openings described herein) where metal (e.g., copper) is then filled by plating. The roughened surface may promote adhesion between the metal and dielectric material (e.g., ABF) in the openings.

For current methods, an additional process step (such as chemical etching) before plating the metal in the openings is typically needed to create surface roughness for adhesion of the metal in the openings. Such chemical etching, however, adds an extra process step and also will attack the sidewalls of the openings, potentially causing undercuts, voids, or rounding of the openings. Thus, eliminating the need for the additional chemical etching allows the sidewalls of the openings to be kept smooth while the bottoms of the opening already have roughness to promote adhesion for the metal to the dielectric material. For example, in some embodiments, the surface roughness of the sidewalls in RDL structures described herein may be at most 100 nm while the bottom surfaces of the features (e.g., surfaces 960) have a higher roughness (e.g., above 500 nm).

Figure 10:
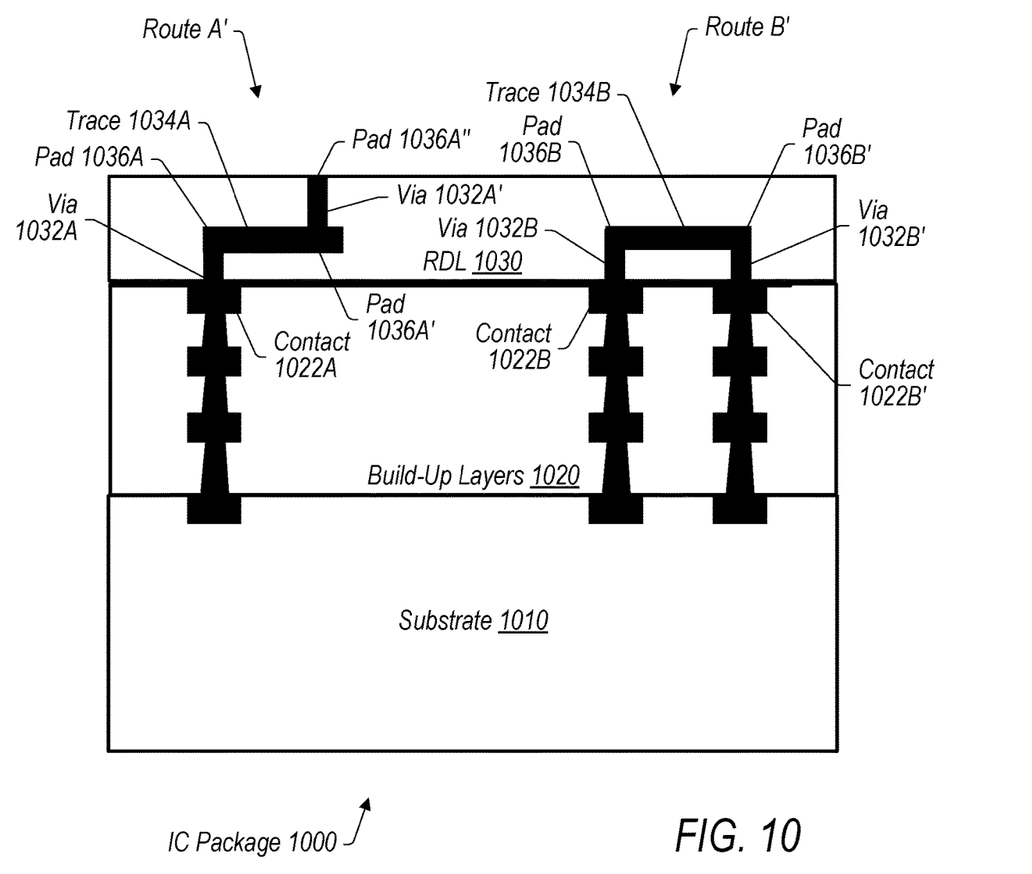
FIG. 10 depicts a representation of an example embodiment of an IC package with an RDL fabricated according to the embodiments described herein.

FIG. 10 depicts a representation of an example embodiment of an IC package with an RDL fabricated according to the embodiments described herein. In the illustrated embodiment, IC package 1000 includes substrate 1010, build-up layers 1020, and RDL 1030. RDL 1030 may be fabricated using, for example, process 300 or process 400, described herein. RDL 1030, when compared to RDL 130 (shown in FIG. 1), provides an illustration of some of the structural advantages associated with fabricating an RDL according to the disclosed embodiments.

For example, in the illustrated embodiment, RDL 1030 includes the same design for "Route A" to connect contact 1022A in build-up layers 1020 on a first side of the RDL to pad 1036A" on a second side of the RDL. Route A' connects to contact 1022A with via 1032A on the first side of RDL 1030. Via 1032A then connects to trace 1034A at pad 1036A. Trace 1034A routes to pad 1036A', which connects to via 1032A'. Via 1032A' provides final routing to pad 1036A" on a second side of the RDL (e.g., the side opposite build-up layers 1020). In comparison to Route A from FIG. 1, Route A' has finer resolutions in pad 1036A and pad 1036A" as these pads do not have a need for the "capture space" associated with pads 136A and 136K. Additionally, vias 1032A and 1032A' have vertical sidewalls and provide finer resolution than vias 132A and 132A' in FIG. 1.

Route B' in RDL 1030 routes between contact 1022B and contact 1022B' with both contacts on the first side of RDL 1030 in build-up layers 1020. Contact 1022B connects to the routing at via 1032B, which connects to trace 1034B at pad 1036B. Trace 1034B then routes to pad 1036B'. Pad 1036B' connects to via 1032B', completing the route between contact 1022B and contact 1022B'. In comparison to Route B from FIG. 1, Route B' has a finer pattern resolution as both pads 1036B, pad 1036B' and vias 1032B, 1032B' have finer resolutions than their corresponding pads 136B, 136B' and vias 132B and 132B' from FIG. 1. Accordingly, as shown in FIG. 10, both Route A' and Route B' displace (e.g., reroute or redistribute) connections to different locations in IC package 1000 with finer resolution patterning and better pattern fidelity in the transfer of a designed pattern than IC package 100, shown in FIG. 1.

While the embodiments of redistribution layers depicted herein (such as shown in FIGS. 7-10) include a first routing layer with vias formed below a second routing layer with pads and traces, additional embodiments may be contemplated where the first routing layer with vias is formed above the second routing layer with pads and traces using the disclosed techniques and structures. In such embodiments, for example, traces in the second routing layer can extend upwards into the first routing layer and have various end portion shapes in the first routing layer. Additionally, in such embodiments, the bottom surfaces of vias would be aligned with the top surfaces of pads.

Example Computer System

Figure 11:
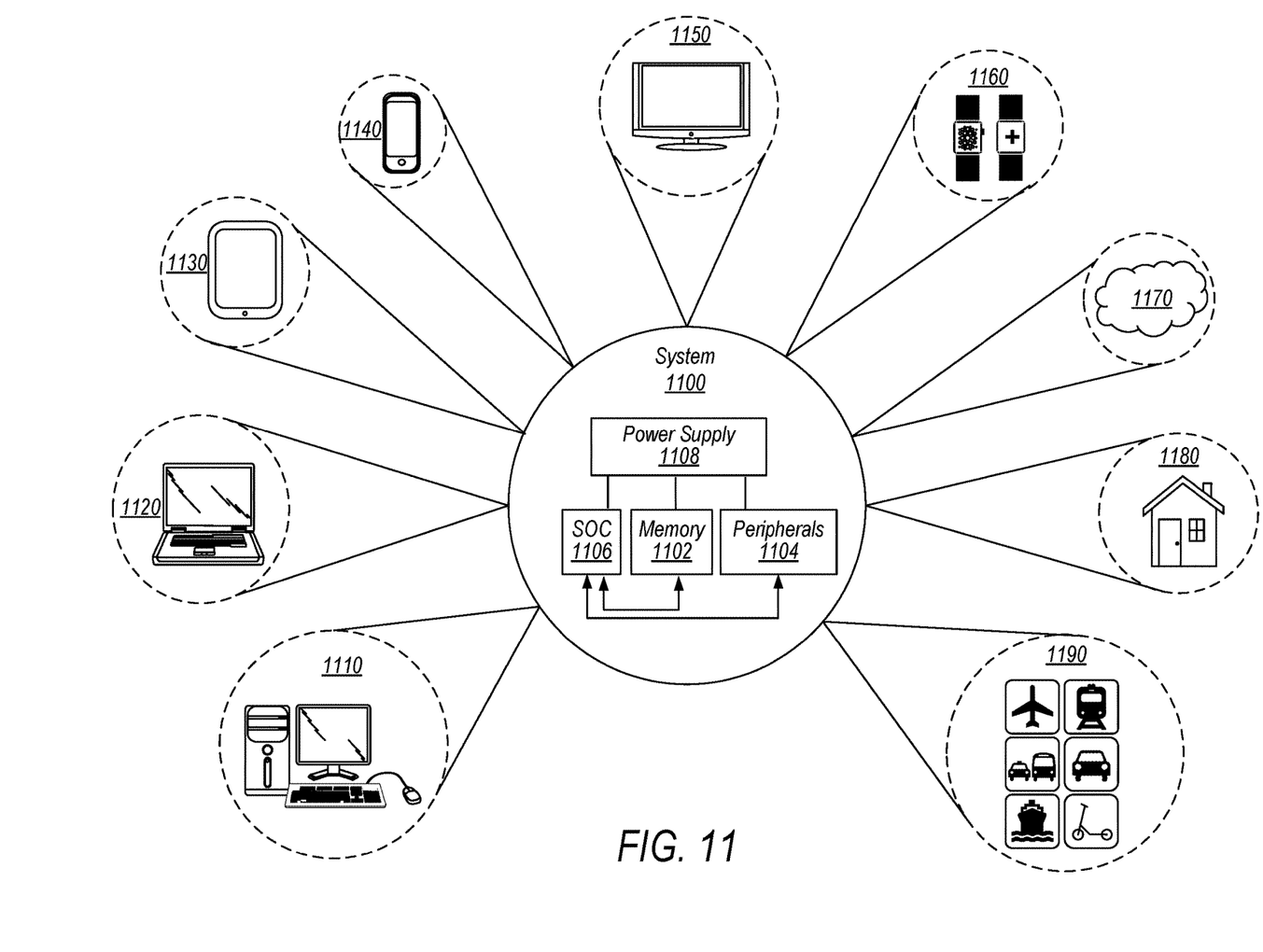
FIG. 11 is a block diagram of one embodiment of an example system.

Turning next to FIG. 11, a block diagram of one embodiment of a system 1100 is shown that may incorporate and/or otherwise utilize the methods and mechanisms described herein. In the illustrated embodiment, the system 1100 includes at least one instance of a system on chip (SoC) 1106 which may include multiple types of processing units, such as a central processing unit (CPU), a graphics processing unit (GPU), or otherwise, a communication fabric, and interfaces to memories and input/output devices. In some embodiments, one or more processors in SoC 1106 includes multiple execution lanes and an instruction issue queue. In various embodiments, SoC 1106 is coupled to external memory 1102, peripherals 1104, and power supply 1108.

A power supply 1108 is also provided which supplies the supply voltages to SoC 1106 as well as one or more supply voltages to the memory 1102 and/or the peripherals 1104. In various embodiments, power supply 1108 represents a battery (e.g., a rechargeable battery in a smart phone, laptop or tablet computer, or other device). In some embodiments, more than one instance of SoC 1106 is included (and more than one external memory 1102 is included as well).

The memory 1102 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 1104 include any desired circuitry, depending on the type of system 1100. For example, in one embodiment, peripherals 1104 includes devices for various types of wireless communication, such as Wi-Fi, Bluetooth, cellular, global positioning system, etc. In some embodiments, the peripherals 1104 also include additional storage, including RAM storage, solid state storage, or disk storage. The peripherals 1104 include user interface devices such as a display screen, including touch display screens or multi-touch display screens, keyboard or other input devices, microphones, speakers, etc.

As illustrated, system 1100 is shown to have application in a wide range of areas. For example, system 1100 may be utilized as part of the chips, circuitry, components, etc., of a desktop computer 1110, laptop computer 1120, tablet computer 1130, cellular or mobile phone 1140, or television 1150 (or set-top box coupled to a television). Also illustrated is a smartwatch and health monitoring device 1160. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 1100 may further be used as part of a cloud-based service(s) 1170. For example, the previously mentioned devices, and/or other devices, may access computing resources in the cloud (i.e., remotely located hardware and/or software resources). Still further, system 1100 may be utilized in one or more devices of a home 1180 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 11 is the application of system 1100 to various modes of transportation 1190. For example, system 1100 may be used in the control and/or entertainment systems of aircraft, trains, buses, cars for hire, private automobiles, waterborne vessels from private boats to cruise liners, scooters (for rent or owned), and so on. In various cases, system 1100 may be used to provide automated guidance (e.g., self-driving vehicles), general systems control, and otherwise. These any many other embodiments are possible and are contemplated. It is noted that the devices and applications illustrated in FIG. 11 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit package, comprising:
   a substrate having at least one layer of insulating material layer built-up in a vertical dimension;
   a redistribution structure formed on the substrate, wherein at least one redistribution layer in the redistribution structure includes:
   a first routing layer formed in an organic dielectric material, wherein the first routing layer includes:
   one or more via interconnects, wherein sidewalls of the via interconnects are substantially vertical; and
   a second routing layer formed in the organic dielectric material, the second routing layer being adjacent the first routing layer in the vertical dimension, wherein the second routing layer includes:
   one or more via landing pads, wherein the via landing pads are individually coupled to the via interconnects; and
   one or more traces, wherein at least one trace in the second routing layer has a length in the vertical dimension that is greater than a vertical height of the second routing layer such that at least a portion of the at least one trace extends to a first depth in the first routing layer from the second routing layer, the portion of the at least one trace extending into the first routing layer terminating in the first routing layer, and wherein at least one additional trace in the second routing layer has a length in the vertical dimension that is greater than a vertical height of the second routing layer such that at least a portion of the at least one additional trace extends to a second depth in the first routing layer from the second routing layer, the second depth being different than the first depth.

2. The package of claim 1, wherein the at least one trace routes from a first location in the second routing layer to a second location in the second routing layer, the second location being horizontally displaced from the first location in the second routing layer.

3. The package of claim 1, wherein centers of the individual via landing pads are horizontally aligned with centers of the individual via interconnects coupled to said individual via landing pads.

4. The package of claim 1, wherein at least one of the individual via landing pads is only coupled to one individual via interconnect, and wherein the individual via landing pad has a width about the same as a width of the individual via interconnect.

5. The package of claim 1, wherein at least one of the via interconnects has a multi-tiered structure within the first routing layer.

6. The package of claim 1, further comprising at least one additional trace that has a length in the vertical dimension that is at most the vertical height of the second routing layer.

7. The package of claim 1, further comprising at least one additional trace that has a length in the vertical dimension that is similar to a combined vertical height of the first routing layer and the second routing layer.

8. The package of claim 1, further comprising at least one additional trace that has a different thickness than the at least one trace.

9. The package of claim 1, wherein the at least one trace terminates in the first routing layer, and wherein an end portion of the at least one trace in the first routing layer has a non-rectangular shape.

10. An integrated circuit package, comprising:
a substrate having at least one layer of insulating material layer built-up in a vertical dimension;
a redistribution structure formed on the substrate, wherein at least one redistribution layer in the redistribution structure includes:
a first routing layer formed in an organic dielectric material, wherein the first routing layer includes:
one or more via interconnects, wherein sidewalls of the via interconnects have a surface roughness of at most 100 nm, and wherein at least one via interconnect has a width of at most 15 μm; and
a second routing layer formed in the organic dielectric material, the second routing layer being adjacent the first routing layer in the vertical dimension, wherein the second routing layer includes:
one or more via landing pads, wherein the via landing pads are individually coupled to the via interconnects; and
one or more traces, wherein at least one trace connects to a first via landing pad that is coupled to a first via interconnect, wherein a bottom surface of the at least one trace has a surface roughness above 500 nm.

11. The package of claim 10, wherein at least one trace has a width and spacing of at most 5 μm.

12. The package of claim 10, wherein a bottom surface of the at least one trace at an interface between the first routing layer and the second routing layer has a roughened surface.

13. The package of claim 10, wherein the at least one trace extends at least a depth of the second routing layer.

14. The package of claim 10, wherein at least a portion of the at least one trace extends into the first routing layer.

15. The package of claim 14, wherein the portion of the at least one trace extending into the first routing layer has an irregular polygon shape.

16. The package of claim 10, wherein the surface of the at least one via landing pad at the interface is a bottom surface of the at least one via landing pad, and wherein the surface of the at least one via interconnect at the interface is a top surface of the at least one via interconnect.

17. An integrated circuit package, comprising:
a substrate having at least one layer of insulating material layer built-up in a vertical dimension;
a redistribution structure formed on the substrate, wherein at least one redistribution layer in the redistribution structure includes:
a first routing layer formed in an organic dielectric material, wherein the first routing layer includes:
one or more via interconnects, wherein sidewalls of the via interconnects are substantially vertical; and
a second routing layer formed in the organic dielectric material, the second routing layer being adjacent the first routing layer in the vertical dimension, wherein the second routing layer includes:
one or more via landing pads, wherein the via landing pads are individually coupled to the via interconnects; and
one or more traces, wherein at least one trace is connected to at least one via landing pad that is coupled to at least one via interconnect, and wherein the at least one trace, the at least one via interconnect, and the at least one via landing pad are configured to route power between a first location in the redistribution structure and a second location in the redistribution structure, and wherein the at least one trace has a depth in the vertical dimension that is at least a depth of the second routing layer with at least a portion of the at least one trace extending into the first routing layer; and
wherein at least a second trace is connected to at least a second via landing pad that is coupled to at least a second via interconnect, wherein the second trace has a depth in the vertical dimension that is at least a depth of the second routing layer with at least a portion of the second trace extending into the first routing layer a different depth than the at least one trace.

18. The package of claim 17, wherein the portion of the at least one trace that extends into the first routing layer terminates in the organic dielectric material of the first routing layer.

* * * * *